(12) United States Patent
Zortea et al.

(10) Patent No.: US 9,680,490 B2
(45) Date of Patent: Jun. 13, 2017

(54) BACKGROUND CALIBRATION OF INTERLEAVED TIMING ERRORS IN DIGITAL TO ANALOG CONVERTERS

(71) Applicant: MULTIPHY LTD., Ness-Ziona (IL)

(72) Inventors: Anthony Eugene Zortea, Pipersville, PA (US); Russell Romano, Allentown, PA (US)

(73) Assignee: MULTIPHY LTD., Ness-Ziona (IL)

( * ) Notice: Subject to any disclaimer, the term of this patent is extended or adjusted under 35 U.S.C. 154(b) by 0 days.

(21) Appl. No.: 15/239,067

(22) Filed: Aug. 17, 2016

(65) Prior Publication Data

US 2017/0054447 A1 Feb. 23, 2017

Related U.S. Application Data

(60) Provisional application No. 62/205,945, filed on Aug. 17, 2015.

(51) Int. Cl.
*H03M 1/10* (2006.01)
*H03M 1/66* (2006.01)
*H04B 1/00* (2006.01)
*H04B 17/11* (2015.01)

(52) U.S. Cl.
CPC ......... *H03M 1/1033* (2013.01); *H03M 1/662* (2013.01); *H04B 1/0028* (2013.01); *H04B 17/11* (2015.01)

(58) Field of Classification Search
CPC ...... H03M 1/1033; H03M 1/662; H03M 1/10; H04B 17/11; H04B 1/0028
USPC .......................................... 341/117–120, 144
See application file for complete search history.

(56) References Cited

U.S. PATENT DOCUMENTS

| | | | | |
|---|---|---|---|---|
| 7,148,828 B2 * | 12/2006 | Fernandez | .............. | H03M 1/10 341/120 |
| 8,860,514 B2 * | 10/2014 | Weltin-Wu | ............ | H03K 5/131 331/143 |
| 2008/0151976 A1 * | 6/2008 | Stoye | .................. | H04L 27/2613 375/219 |

* cited by examiner

*Primary Examiner* — Jean B Jeanglaude
(74) *Attorney, Agent, or Firm* — FisherBroyles, LLP; Robert Kinberg

(57) ABSTRACT

System and method for the calibration of interleave time errors in an n-level PAM Digital to Analog Converter (DAC), according to which a set of two samplers with adjustable sample time and threshold are introduced at the output of the DAC, which are separated in time. The set of samplers is swept through a n unit interval (UI) window and the n-UI window is classified to periods of transitions and non-transitions on an eye diagram. The relative timing of the lower rate clocks into an n:1 multiplexer is controlled using a control loop, to force equal eye width within the n-UI window and the interleaved timing errors are measured and corrected, until the uneven distribution is being reduced below a predetermined level.

6 Claims, 4 Drawing Sheets

BACKGROUND CALIBRATION OF INTERLEAVED TIMING ERRORS IN DIGITAL TO ANALOG CONVERTERS

CROSS-REFERENCE TO RELATED APPLICATION

This application claims the benefit of U.S. Provisional Application No. 62/205,945, filed Aug. 17, 2015, the disclosure of which is incorporated herein by reference in its entirety.

FIELD OF THE INVENTION

The present invention relates to the area of electronic Digital-To-Analog Converters (DACs). More particularly, the present invention relates to a method and system for correcting interleaved timing errors in DACs.

BACKGROUND OF THE INVENTION

In communications systems, data is transmitted at high speed. Sometimes the speed of the communication means is higher than that of the data to be transmitted over them. In order to utilize the entire speed of the communication system, a plurality of relatively low speed data signals can be mixed to a single high speed signal, by alternating between them. This method is called interleaving.

For example, four data signals of 10 GHz each can be mixed to a single 40 GHz transmission signal, whereas a quarter of the transmission signal's time space is allocated to each data signal.

High speed DACs are often constructed in a time interleaved fashion, in which data signals are processed and finally multiplexed together, to form a higher speed transmission signal.

Typical time interleaved DACs are constructed as "half rate" or "quarter rate", thereby implying the amount of time space allocated for each data signal in the transmission signal.

The timing and synchronization of the data signals are controlled by a timing circuit, e.g. a PLL, which supplies a clock signal for each data signal at the frequency of the data signals, $f_d$. Each clock signal is introduced with a time difference of $$\frac{1}{f_d * x}$$

seconds relative to the other clock signals, wherein x is the order of modulation. In the example above, the four data signals of 10 GHz are each provided with a clock signal of 10 GHz with a time difference of 25 picoseconds between each other. This introduces each data signal a time space sufficient to its frequency, while not overlapping other data signals.

Due to imperfections in analog and digital circuitry, the lower rate data signals are normally not multiplexed with perfect spaced timing. This imperfect spaced timing introduces distortion and degrades the Signal-to-total-Noise and Distortion Ratio (SNDR), which can also be seen on an eye diagram.

An eye diagram is a methodology to represent and analyze high speed digital signals (such as optical and base band signals), their quality and the ability to perform clock and data recovery. For all waveforms, the eye diagram allows parameters of the electrical quality of the signal to be visualized. The data eye diagram is constructed from a digital waveform by folding the parts of the waveform corresponding to each individual symbol into a single graph with signal amplitude on the vertical axis and time on horizontal axis. This construction is repeated over many samples of the waveform, the resultant graph will represent the average statistics of the signal and will resemble an eye. The eye opening corresponds to one symbol period and is typically called the Unit Interval (UI) width of the eye diagram. The eye diagram offers additional information beyond the time domain waveform display, including impairments such as attenuation, noise, crosstalk, etc.

FIG. 1. (prior art) illustrates an EYE diagram of a PAM-4 quarter-rate DAC with interleaved timing errors. Unequal eye widths and heights are visible. These distortions and degradations, introduced by imperfect timing, are related to as interleaved timing errors.

Interleaved timing errors can vary in a number of manners:
differences between data signal time frames;
differences between DACs;
differences between dies; and
differences between processes, operating temperatures, power supply voltages etc., which appear over time.

Calibration of interleaved timing errors and of the systems which produce them, can be performed using a method called "foreground calibration", according to which special test signals are introduced at each of the data signal inputs and are tested for time optimization. This method introduces a period of time at which the DAC is not resolving true input data signals, which is not acceptable for some applications. In addition foreground calibration introduces slowdown in the final data transmission.

Another existing method for calibrating interleaved timing errors is by using special circuitry. However, this solution is expensive in terms of die area or power dissipation.

An alternative method is a onetime calibration (e.g., at power-up), where the calibration scheme does not interfere with the transmission scheme once the latter has begun. This method however is not optimal, since the calibration will degrade over time, which entails SNDR degradation over time, when the errors themselves change over time, due to the fact that temperature or other condition changes.

It would be advantageous to calibrate time interleaved errors without interfering normal data transmission, while maintaining calibration throughout the entire transmission scheme, using an economical system.

It is therefore an object of the present invention to provide a method and system for calibrating time interleave errors without interfering data transmission, while maintaining calibration throughout the whole transmission scheme, using an economical system.

Other objects and advantages of this invention will become apparent as the description proceeds.

SUMMARY OF THE INVENTION

The present invention is directed to a method for the calibration of interleave time errors in an n-level PAM Digital to Analog Converter (DAC), according to which a set of two samplers with adjustable sample time and threshold are introduced at the output of the DAC, which are separated in time. The set of samplers is swept through a n unit interval (UI) window and the n-UI window is classified to periods of transitions and non-transitions on an eye diagram. The relative timing of the lower rate clocks into an n:1 multiplexer is controlled using a control loop, to force equal eye width within the n-UI window and the interleaved timing errors are measured and corrected, until the uneven distribution is being reduced below a predetermined level.

Sweeping the two samplers may be done using a plesiochronous clock signal for the two samplers. The output of the two samplers may be XOR-ed, in order to measure the interleaved timing errors.

The present invention is directed to a system for calibrating interleaved timing errors in a n-level PAM DAC, which comprises:
a) two samplers for sampling the output of the DAC;
b) a XOR gate for receiving the output of the two samplers and for detecting transition and non-transition time slots;
c) circuitry for detecting and measuring uneven distribution of non-transition time-slots within n-UIs; and
d) circuitry for adjusting clock signal timing of an erroneous UI, until the uneven distribution is being reduced below a predetermined level.

DETAILED DESCRIPTION OF THE INVENTION

The present invention describes a method and system for calibrating interleave timing errors, by performing calibration in the background, without interfering the data transmission, enabling the removal of interleave timing errors without the use of special test signals, and without depending on signal statistics.

According to the invention, two samplers are introduced at the output of a DAC. The sampling time and threshold of the samplers are adjustable, and are controlled in a control loop to measure and correct the interleaved timing errors.

Figure 1:
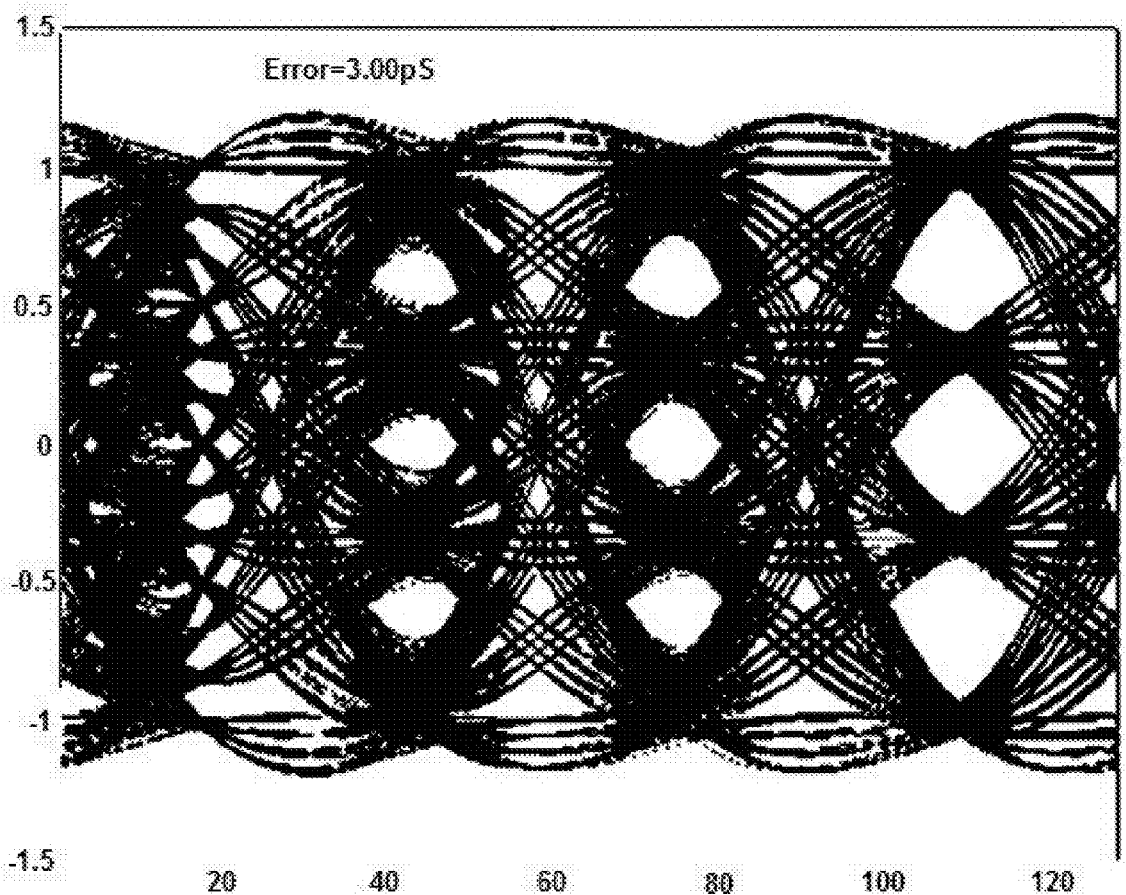
FIG. 1 (prior art) illustrates an eye diagram of a PAM-4 quarter-rate DAC with interleaved timing errors.
Figure 2:
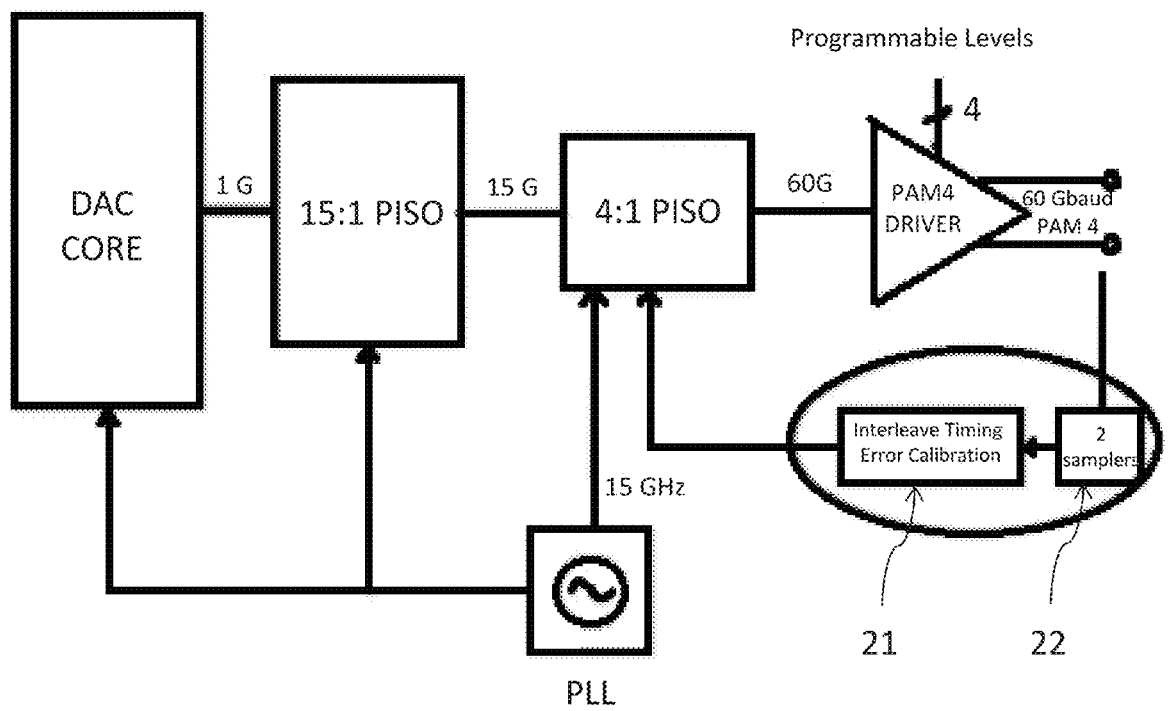
FIG. 2 shows an illustration of a quarter-rate DAC with 2 threshold and timing controllable samplers, according to an embodiment of the present invention.

FIG. 2 shows an illustration of a quarter-rate DAC with 2 threshold and timing controllable samplers, 21, and a time interleave calibration block, 22, according to an embodiment of the present invention. The two samplers, 21, receive DAC output with a time displacement of a magnitude which allows several different samples for each transmission cycle. The DAC output is swept through n unit intervals (UI) by the two samplers, n being the order of the PAM modulation.

The sampled signals, being two variations of the same signal with a displacement between them, are inserted to time interleave calibration block, 22, to a XOR gate, for detecting transition and non-transition time slots; This is to say that if no transition occurred the XOR will receive two signals of the same polarity (either high or low—i.e. either above the threshold or under) and will produce a low polarity signal (logic "0"), and if a transition occurred the XOR will receive two signals of opposite polarity (being on different sides of the threshold) and will produce a high polarity signal (logic "1"). The XOR output is a logical representation of the time interleaved error. The output of the XOR can be measured to detect errors in time allocation of data signals and to detect time interleave errors. In the ideal state all n UIs appear at the output with the same width of non-transition, expressed by logic "0". In a non-ideal state, at least one of the UIs is narrower than others. This means there are interleaved errors.

If a time interleave error is detected in a UI, the clock signal related to the same UI is adjusted to allow the correct time allocation for the data signal. For example, if a time interleave error of 5 picoseconds is detected in a UI allocated with 25 picoseconds, the clock signal will be either delayed or set back by 5 picoseconds, according to the negativity or positivity of the error, respectively.

Figure 3:
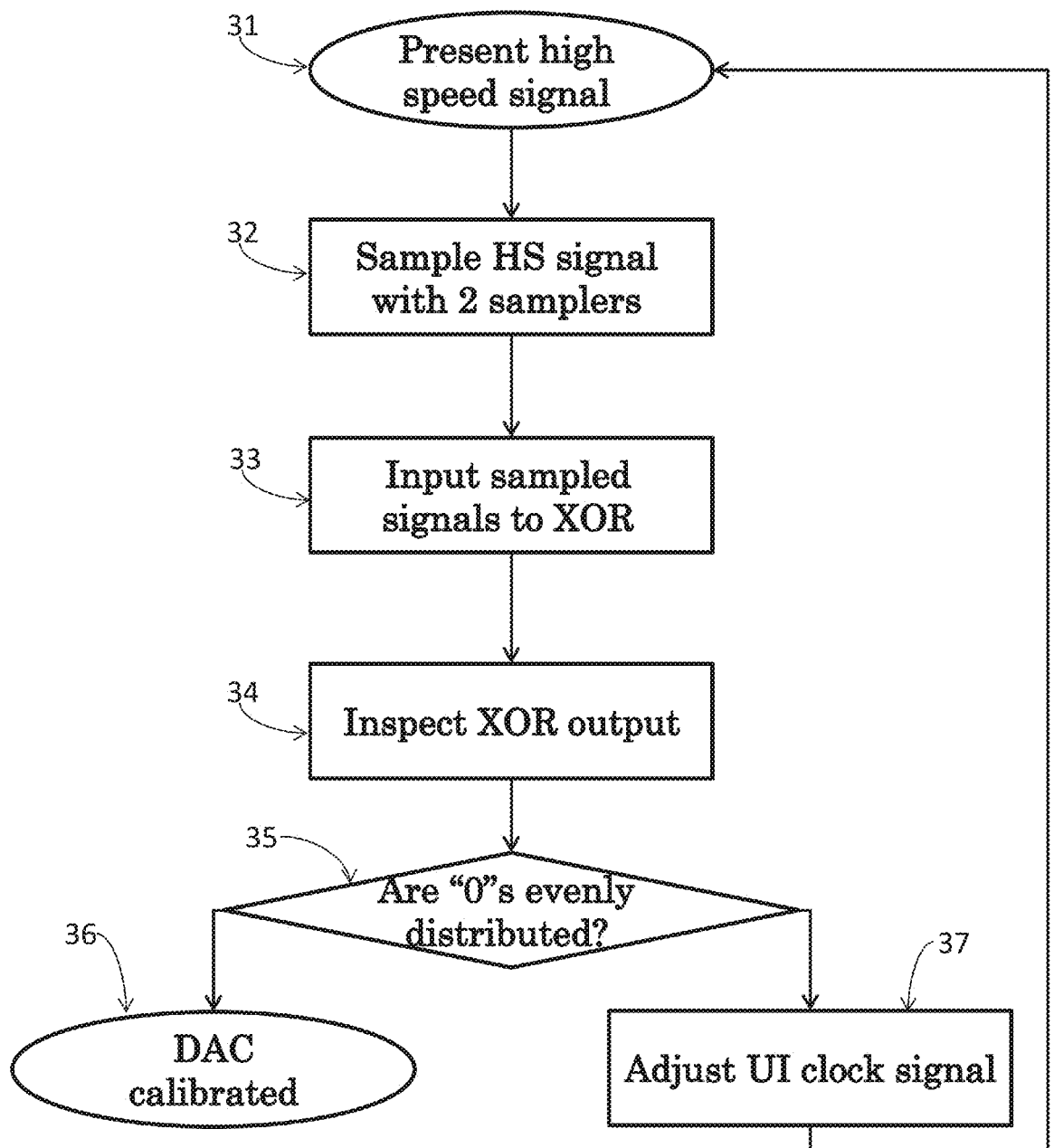
FIG. 3 shows a flowchart of the calibration process according to an embodiment of the invention.

FIG. 3 shows a flowchart of the calibration process according to an embodiment of the invention. In the first step 31, two samplers receive DAC output with a time displacement of a magnitude which allows several different samples for each transmission cycle. In the next step 32 the output is swept (sampled) by the two samplers through four unit intervals (UI). The use of four UI is in the case of a quarter-rate DAC, in order to correct the errors in respect to each of the four data signals. In the next step, 33, the sampled signals are inserted to a XOR gate for detecting transition and non-transition time slots. In the next step, 34, the non-transition time slots in the output of the XOR gate are inspected for detecting UIs with time interleave errors. In the next step, 35, the process tests whether errors exist, i.e., whether the non-transition time slots are evenly distributed. If no errors exist, the process continues to final step 36 in which the DAC is determined to be calibrated. If errors exist the process continues to step 37, wherein the clock signal of the erroneous UIs are adjusted according to the detected errors. The calibration process continues until all the UIs are evenly distributed and there are no time interleaved errors, i.e. until step 36 is reached.

Sweeping the two samplers may be done using a plesiochronous (almost, but not quite, perfectly synchronized) clock signal for the two samplers.

Figure 4:
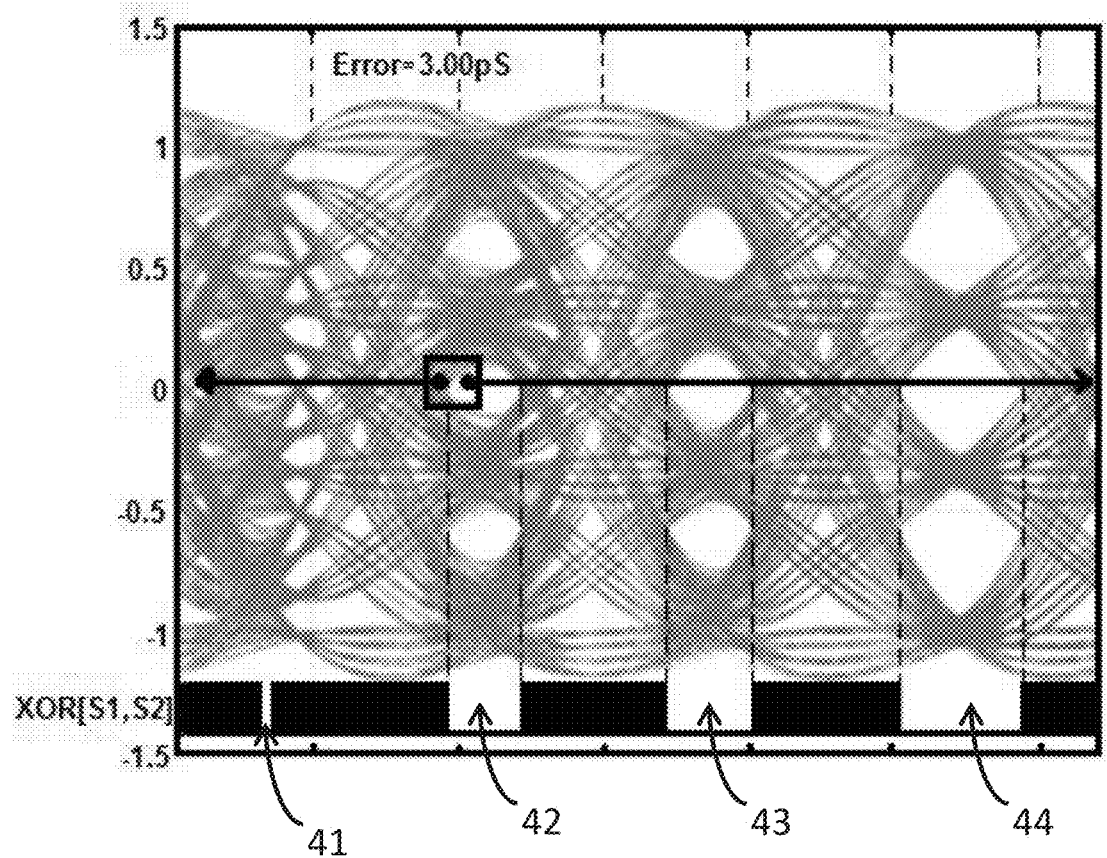
FIG. 4 illustrates an example of an eye diagram of 4 UI of a PAM4 modulated signal and the corresponding XOR output, according to an embodiment of the invention.

FIG. 4 illustrates an example of an eye diagram of 4 UI of a PAM4 modulated signal and the corresponding XOR output, according to an embodiment of the invention. It can be seen that the non-transition time slots, 41-44, are unevenly distributed. This directly corresponds to the uneven eye "openness". In the example of FIG. 4, time slot 41 is too narrow, and therefore the clock signal related to the first UI will be adjusted to allocate more time for the first UI. The clock signals of the remaining time slots can be adjusted similarly, until all the UIs are evenly distributed and no time interleave errors appear in the system.

As various embodiments have been described and illustrated, it should be understood that variations will be apparent to one skilled in the art without departing from the principles herein. Accordingly, the invention is not to be limited to the specific embodiments described and illustrated in the drawings.

The invention claimed is:
1. A method for the calibration of interleave time errors in an n-level PAM Digital to Analog Converter (DAC), comprising:
a) introducing a set of two samplers with adjustable sample time and threshold, at the output of said DAC, which are separated in time;
b) sweeping said set of samplers through a n unit interval (UI) window;
c) classifying said n-UI window to periods of transitions and non-transitions on an eye diagram;

d) controlling the relative timing of the lower rate clocks into an n:1 multiplexer using a control loop, to force equal eye width within said n-UI window; and e) measuring and correcting the interleaved timing errors, until the uneven distribution is being reduced below a predetermined level.

2. A method according to claim 1, wherein sweeping the two samplers is done using a plesiochronous clock signal for the two samplers.

3. A method according to claim 1, wherein the output of the two samplers is XOR-ed, in order to measure the interleaved timing errors.

4. A system for calibrating interleaved timing errors in a n-level PAM DAC, comprising:

a) two samplers for sampling the output of said DAC;

b) a XOR gate for receiving the output of said two samplers and for detecting transition and non-transition time slots;

c) circuitry for detecting and measuring uneven distribution of non-transition time-slots within n-UIs; and d) circuitry for adjusting clock signal timing of an erroneous UI, until said uneven distribution is being reduced below a predetermined level.

5. A system according to claim 4, in which the two samplers are swept using a plesiochronous clock signal for the two samplers.

6. A system according to claim 4, further comprising a XOR gate for XOR-ing the output of the two samplers, in order to measure the interleaved timing errors.

* * * * *